(12) United States Patent
Yun et al.

(10) Patent No.: US 6,327,760 B1
(45) Date of Patent: Dec. 11, 2001

(54) METHOD OF MANUFACTURING A PIEZOELECTRIC/ELECTROSTRICTIVE MICROACTUATOR

(75) Inventors: Sang Kyeong Yun; Dong Hoon Kim, both of Kyungki-Do; Yeon Kyoung Jung, Seoul, all of (KR)

(73) Assignee: Samsung Electro-Mechanics Co., Kyungki-Do (KR)

( * ) Notice: Subject to any disclaimer, the term of this patent is extended or adjusted under 35 U.S.C. 154(b) by 0 days.

(21) Appl. No.: 09/429,830

(22) Filed: Oct. 29, 1999

(30) Foreign Application Priority Data

Jul. 7, 1999 (KR) .................................................. 19-27323

(51) Int. Cl.$^7$ .................................................. H01L 41/00
(52) U.S. Cl. .................. 29/25.35; 310/328; 310/800; 427/100
(58) Field of Search ...................................... 310/800, 328; 29/25.35; 347/70–72; 427/100

(56) References Cited

U.S. PATENT DOCUMENTS 4,700,203   10/1987   Yamamuro et al. ................. 346/140

*Primary Examiner*—Carl E. Hall
(74) *Attorney, Agent, or Firm*—Darby & Darby

(57) ABSTRACT

A piezoelectric/electrostrictive microactuator is made by forming piezoelectric/electrostrictive film using a mixture of the polyvinylidene fluoride, excellent in moldability and a ceramic powder, excellent in piezoelectricity. The powder has basic composition elements of lead titanium with a particle size below 5 $\mu$m, made by a nonexplosive oxidative-reductive combustion reaction at a relatively low temperature of 100–500° C. The piezoelectric/electrostrictive microactuator may be modulated in mechanical strength and linkability between particles by using an improved colloid process which can achieve low energy consumption and low cost, because the low temperature process is simplified by using ceramic powder calcined at low temperatures.

42 Claims, 1 Drawing Sheet

METHOD OF MANUFACTURING A PIEZOELECTRIC/ELECTROSTRICTIVE MICROACTUATOR

BACKGROUND OF THE INVENTION

1. Field of the Invention

The present invention relates to a piezoelectric/electrostrictive microactuator and a manufacturing method thereof. In particular, the present invention relates to a piezoelectric/electrostrictive microactuator using a mixture of ceramic powder and polyvinylidene fluoride and a manufacturing method thereof.

2. Description of the Prior Art

An ink jet printer head actuator using a piezoelectric substance is usually composed of an infrastructure made of a vibration plate and a chamber, a piezoelectric substance which undergoes mechanical deformation if electricity is applied is connected on the vibration plate, and electrode(s) which transmit(s) electricity to the piezoelectric substance.

The piezoelectric substance of an actuator has characteristics of poling by which a directionality is given the piezoelectric substance when an electric field is applied. If electricity is supplied to an upper and a lower electrode formed on and under the piezoelectric substance under the poling state, the piezoelectric substance located between the electrodes undergoes mechanical deformation or vibrates with recycling of deformation and restoration.

In the ink jet printer head, ink is sprayed onto a record medium as the vibration plate undergoes mechanical deformation, in thickness, if the piezoelectric substance of the actuator vibrates.

Hitherto a ceramic powder manufactured by a solid phase process has been used to manufacture a piezoelectric/electrostrictive film used as the piezoelectric substance in the piezoelectric/electrostrictive actuator.

The solid phase process, also called oxide process, manufactures the ceramic powder by mixing a raw material containing powder oxides or molten salts to thermally treat it at 1000–1200° C., to pulverize it, and then to sinter it.

Ceramic powder manufactured by such a solid phase process has a disadvantage in that the generated particle size, which is as large as 0.2–2 µm, varies in raw material powder size and in that it needs high temperature heat treatment over 1000° C., according to the process characteristics.

In manufacturing various film types of device using the ceramics, heretofore the process has mainly been used to prepare ceramic paste using a ceramic powder to print it on the vibration plate or to fill it in a mold to thermally treat it.

To prepare ceramic paste traditionally, ceramic grains have been added, with an average particle diameter above I µm manufactured by a solid phase process, into a solution where binder, vehicle, plasticizer, dispersant etc. are dissolved in solvent, then to mix and agitate it.

In order to manufacture a piezoelectric/electrostrictive film using the ceramic paste prepared by the method, the paste is printed on a vibration plate to be dried at 130° C. and thermally treated above 1000° C. A problem is encountered, in that a separate additional heat treatment is needed above 500° C. for binder removal work to completely remove the added organic material component, before the heat treatment after drying.

And there is another problem that the vibration plate is limited to materials which can endure heat treatment above 1000° C., because the ceramic paste prepared by the method cannot be molded at low temperatures so it must be thermally treated above 1000° C.

Also there is a problem in that diverse applications are limited, as the material has no plasticity at all.

Here, a technique is needed to impart flexibility to the ceramic device, without affecting piezoelectric characteristics for sake of permitting diverse applications of the piezoelectric/electrostrictive ceramic device.

Polyvinylidene fluoride {PVDF} is a typical raw material used for preparation of complex substances and widely applied in molding electrodes of a secondary battery PVDF is a polymer having piezoelectric characteristics, which is utilized so that products using the characteristics of PVDF itself are marketed.

But there is problem that its piezoelectric characteristics are lower than that of ceramic powder although it is very moldable.

Thus, a method has been developed to manufacture a ceramic device by mixing the ceramic powder (excellent in piezoelectric characteristics) and the PVDF (excellent in moldability).

In the process the mixture is obtained by placing piezoelectric/electrostrictive ceramic powder, PVDF and a small quantity of binder into an organic solvent of toluene, hexanol etc., then uniformly mixing it by agitating or refluxing, and finally by uniformly mixing it by agitating or refluxing, and finally by vaporizing the solvent and drying the product.

The mixture obtained is processed into a thick film type by rolling process, wherein the thickness of the thick film is determined according to the mixture processibility and the rolling condition.

Differences arise in processibility according to mixing ratio of ceramic powder and PVDF. If PVDF content is increased, processibility is enhanced, but a loss of piezoelectric properties is accompanied by the decrease of ceramic powder content; while if PVDF content is decreased, piezoelectric properties are enhanced at the expense of processibility.

The thick film is made into a device through processes of poling, after electrode treatment, according to the application objective.

In mixing the ceramic powder and the PVDF, minimalization of voids is desireable for uniform mixing, which should be attained to enhance the mechanical properties of the formed film.

Finer ceramic powder use is preferable to minimize voids in a mixture of a definite content ratio of ceramic powder and PVDF.

But there is a problem in traditional ceramic powder that it is difficult to mix it effectively, as particle size is large, as explained above.

Also there is problem in that usable vibration plate range is restricted because a high temperature heat treatment over 1000° C. is necessary, according to ceramic powder characteristics.

SUMMARY OF THE INVENTION

The present invention, to solve the problems, provides a piezoelectric/electrostrictive microactuator of improved linkability and mechanical strength by forming a piezoelectric/electrostrictive film after mixing the fine ceramic powder, calcined at low temperature, with the PVDE which is a piezoelectric material excellent in moldability.

The present invention, to accomplish the purpose, features a manufacturing method for a piezoelectric/electrostrictive microactuator using a mixture of ceramic powder and polyvinylidene fluoride comprising the steps of: providing a metal vibration plate; preparing a mixture of polyvinylidene fluoride with ceramic powder, the ceramic powder being made by a nonexplosive oxidative-reductive combustion reaction at relatively low temperature of 100–500° C. and having a particle size of below 5 μm and basic composition elements of lead(Pb) and titanium(Ti); forming a piezoelectric/electrostrictive film on the metal vibration plate using the mixture of the ceramic powder and the polyvinylidene fluoride; thermally treating the piezoelectric/electrostrictive film at 100–300° C.; and forming an upper electrode on the piezoelectric/electrostrictive film.

Also, the present invention features a manufacturing method for a piezoelectric/electrostrictive microactuator using a mixture of ceramic powder and polyvinylidene fluoride, comprising the steps of: providing a vibration plate; preparing a mixture of polyvinylidene fluoride with ceramic powder, the ceramic powder being made by nonexplosive oxidative-reductive combustion reaction at a relatively low temperature of 100–500° C. and having a particle size below 5 μm and basic composition elements of lead(Pb) and titanium(Ti); separately forming a piezoelectric/electrostrictive film using the mixture of the ceramic powder and the polyvinylidene fluoride; bonding the piezoelectric/electrostrictive film and the metal vibration plate; and forming an upper electrode on the piezoelectric/electrostrictive film.

In addition, the present invention features a manufacturing method for a piezoelectric/electrostrictive microactuator using a mixture of ceramic powder and polyvinylidene fluoride, comprising the steps of: providing a vibration plate; forming a lower electrode on the vibration plate; preparing a mixture of polyvinylidene fluoride with ceramic powder, the ceramic powder being made by nonexplosive oxidative-reductive combustion reaction at relatively low temperature of 100–500° C. and having a particle size of below 5 μm and basic composition elements of lead(Pb) and titanium(Ti); forming a piezoelectric/electrostrictive film on the lower electrode, using the mixture of the ceramic powder and the polyvinylidene fluoride; thermally treating the piezoelectric/electrostrictive film at 100–300° C.; and forming an upper electrode on the piezoelectric/electrostrictive film.

Furthermore, the present inventions features a manufacturing method of piezoelectric/electrostrictive microactuator using a mixture of ceramic powder and polyvinylidene fluoride, comprising the steps of: providing a vibration plate; forming a lower electrode on the vibraiton palte; preparing a mixture of polyvinylidene fluoride with ceramic powder, the ceramic powder being made by nonexplosive oxidative-reductive combustion reaction at relatively low temperature of 100–500° C. and having a particle size of below 5 μm and basic composition elements of lead(Pb) and titanium(Ti); separately forming a piezoelectric/electrostrictive film using the mixture of the ceramic powder and the polyvinylidene fluoride; bonding the piezoelectric/electrostrictive film and the lower electrode; and forming an upper electrode on the piezoelectric/electrostrictive film.

Also, the present invention features a piezoelectric/electrostrictive microactuator using a mixture of ceramic powder and plyvinylidene fluoride, comprising: a metal vibration plate; a piezoelectric/electrostrictive film formed on the metal vibration plate and including a mixture of polyvinylidene fluoride and ceramic powder, the ceramic powder being made by nonexplosive oxidative-reductive combustion reaction at relatively low temperature of 100–500° C. and having a particle size of below 5 μm and basic composition elements of lead(Pb) and titanium(Ti); and an upper electrode formed on the piezoelectric/electrostrictive film.

Also, the present invention features a piezoelectric/electrostrictive microactuator using a mixture of ceramic powder and polyvinylidene fluoride, comprising: a vibration plate; a lower electrode formed on the vibration plate; a piezoelectric/electrostrictive film formed on the metal vibration plate and including a mixture of polyvinylidene fluoride and ceramic powder, the ceramic powder being made by nonexplosive oxidative-reductive combustion reaction at relatively low temperature of 100–500° C. and having a particle size of below 5 μm and basic composition elements of lead(Pb) and titanium(Ti); and an upper electrode formed on the piezoelectric/electrostrictive film.

DETAILED DESCRIPTION

The present invention will be explained in detail follows.

As for a vibration plate, all of general vibration plate materials such as metals, ceramics, and resinous polymeric organic compounds may be used.

There is no need to form a separate lower electrode if metal is used as a vibration plate, while a separate lower electrode must be formed on a vibration plate if nonconductive materials such as ceramics or resinous polymeric organic compounds are used as a vibration plate.

The lower electrode is formed by a method of evaporation, sputtering or screen printing etc. using of gold (Au), silver (Ag), aluminum (Al), nickel (Ni), platinum (Pt) etc.

A mixture of ceramic powder and PVDF is used for piezoelectric/electrostrictive film material.

As for the ceramic powder, that manufactured by the following process is used, because it is effective to use fine powder to consider the powder reactivity itself and secure system feasibllty at low temperature.

As for raw material containing the constituent ceramic elements, use is made of a ceramic composition element oxide, a ceramic composition element salt with organics or inorganics such as carbonate and nitrate, or a ceramic composition element complex.

As for the constituent ceramic element, it is advisable to use a piezoelectric/electrostrictive ceramic element comprising lead (Pb) and titanium (Ti) as basic composition elements. Especially as for the constituent ceramic element, it is preferable to use that composed of elements including Lead (Pb) zirconium (Zr) and titanium (Ti) or lead (Pb), magnesium (Mg and niobium (Nb).

As for a solvent or a dispersant to dissolve or disperse the raw material of the constituent ceramic elements, one or more are selected from among water and organic solvents that can dissolve or disperse the raw material containing the constituent ceramic element. As for the organic solvents, mainly dimethyl formamide, methoxyethanol, acetic acid, alcohols, glycols are used.

As for a combustion aid agent, use is made of citric acid which is art organic compound that can give rise to a combustion reaction. In a conventional method, citric acid has been used not as a combustion aid but a complexing agent in order to give reaction uniformity and has been used in processes such as the Pechini process, where speed-controlled combustion reaction can be induced using citric acid's flammability and complex formation effect.

Figure 1:
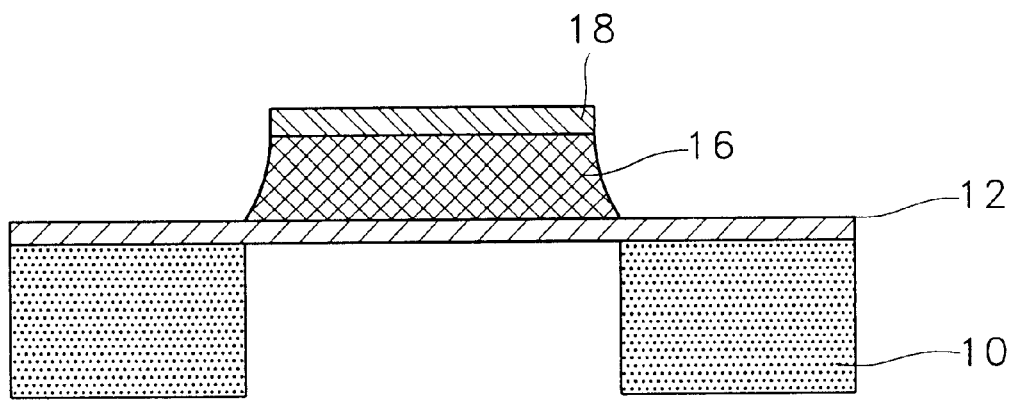
FIG. 1 is a cross-sectional view showing an embodiment of a piezoelectric/electrostrictive microactuator of the present invention.

A mixture is made by adding citric acid into a solution or a dispersed mixture where the constituent ceramic element is dissolved or dispersed, so that mixing takes place with the acid.

The citric acid quantity added shall not be less than the amount necessary to give rise to an oxidative-reductive combustion reaction with the anion of the constituent ceramic element. Reaction speed can be controlled by the citric acid quantity added.

The mixture so mixed with citric acid, in addition, is thermally treated at 100–500° C.

Through ceramic phase crystallinity increases as heat treatment temperature rises, citric acid combustion reaction may start enough only if the heat treatment temperature is over 100° C. Although reaction can arise even if heat treatment temperature is above 500° C., thermally treating above that temperature is meaningless; when compared with the conventional method.

Preferably, it shall be thermally treated at 150–300° C. which temperature range can secure suitably the ceramic phase crystallinity, although it is considerably low temperature range for heat treatment.

Added citric acid is removed during the combustion reaction process, when ceramic oxide is formed without scattering out, by virtue of citric acid reaction heat generated at this time.

In a reaction like this, components other than the ceramic composition element are removed during a sufficiently long combustion reaction, yielding a ceramic powder of pure type without remaining impurity.

The particle size of the ceramic powder obtained by the method is below 5 $\mu$m, and is specifically below 0.5 $\mu$m, therefore extremely fine with uniform powder particle diameter distribution. The primary particles of this powder exist as independent bodies or as soft aggregate type and are in a completely burnt ceramic phase, so that the weight does not decrease, even by additional heat treatment.

Since the powder has excellent surface reactivity, molding is feasible even with only low temperature heat treatment, the vibration plate can be manufactured with a high degree of freedom, and diverse methods of printing and coating can be applied.

Additional heat treatment of the obtained ceramic powder may be conducted at 700–900° C. to increase the crystallinity of the powder thus made.

Polyvinylidene fluoride is mixed with ceramic powder obtained by the process.

As for the mixing of ceramic powder and polyvinylidene fluoride, these two are put into an organic solvent to be uniformly mixed by agitating or refluxing. It is advisable to use toluene or hexanol for the organic solvent.

The mixing ratio of these two shall be adequately determined, considering the processibility and the piezoelectric characteristics of the ceramic device to apply. Polyvinylidene fluoride content shall be increased to improve processibility but ceramic powder content shall be increased to improve piezoelectricity.

When mixing these two, a small amount of coupling agent may be added to facilitate mixing by strongly binding the interface of these two. Inorganics of nitrate, sulfate, phosphate, oxalate etc. are used as the coupling agent.

When mixing these two, ceramic sol having the same or similar composition as the ceramic powder may be used instead of coupling agent or organic solvent.

The ceramic sol is prepared by dissolving the constituent ceramic element in a base of an organic solvent or water. Diverse materials may be used as the organic solvent to be the base, while it is preferable to use acetic acid, dimethyl formamide, methoxyethanol, alcohols or glycols.

As for constituent ceramic element used in preparing ceramic sol, it is preferable to use a composion comprising the constituent ceramic elements including lead (Pb), zirconium (Zr) and titanium (Ti), where it is advisable to use a ceramic sol concentration 0.1–5 M.

It is preferable to have a ceramic sol content of 1–200 parts by weight of ceramic powder and polyvinylidene fluoride when mixing these two in ceramic sol, because mixture viscosity will be too low if ceramic sol content is above 200 parts by weight and the viscosity will be too high if ceramic sol content is below 1 part by weight.

If ceramic sol is used, the ceramic grain surface characteristics are modified and system dispersibility is improved, so that adhesion between particles is increased and uniform film quality may be obtained.

A piezoelectric/electrostrictive film is formed applying the mixture of ceramic powder and polyvinylidene fluoride after completion of mixing.

The mixture of ceramic powder and polyvinylidene fluoride may be used as it is, or it may be used after partly drying, and a small amount of viscosity controlling agent may be added, if needed, as viscosity requires. It is preferable to carry out the partial drying at 70–120° C.

The piezoelectric/electrostrictive film is directly molded on a metal vibration plate, or a ceramic, or a resinous polymeric organic compound vibration plate formed of a lower electrode by screen printing, molding, coating etc. using a mixture of ceramic powder and polyvinylidene fluoride, so as to the thermally treat the film at 100–300° C., or more preferably at 150–250° C.

After separate formation of a piezoelectric/electrostrictive film of desired thickness, it may be bonded with the metal vibration plate or the ceramic or the resinous polymeric organic compound vibration plate formed of the lower electrode. As for the bonding, it may be thermally treated at 100–300° C. or more preferably 150–250° C., or it may be bonded using an adhesive layer.

An upper electrode is formed on the piezoelectric/electrostrictive film. The upper electrode is formed also by evaporation, sputtering or screen printing etc. using of gold (Au), silver (Ag), aluminum (Al), nickel (Ni), platinum (Pt) etc.

There is no need for separate poling when polyvinylidene fluoride finished with poling is used, while poling is used after the upper electrode formation when polyvinylidene fluoride not finished with poling is used.

The method of the present invention, as above, can produce a piezoelectric/electrostrictive microactuator modulated of mechanical strength and linkability between particles, by way of an improved colloid process using the mixture of polyvinylidene fluoride (having excellent moldability) and ceramic powder sintered at low temperature (having fine particle size and excellent piezoelectric properties).

A process of low energy and low cost can be achieved, as the process is made simple with low temperature by using the ceramic powder produced at low temperature.

The mixture of the present invention has been improved in the degree of molding freedom, as it is easy to handle and may be applied in diverse ceramic devices, besides the piezoelectric/electrostrictive microactuator, by processibility adjustment by the mixing ratio modulation.

The present invention is once again explained in some more detail by the following examples. But the following application examples are only illustrations of the present invention and do not confine the extent of the invention.

EXAMPLE 1

Polyvinylidene fluoride and fine piezoelectric/electrostrictive ceramic powder below 0.5 μm of particle diameter made through a nonexplosive oxidative-reductive combustion process was mixed by reflux under hexanol in a volume ratio of 60:40.

The solvent was partly dried at 100° C. after which the slurry-type mixture obtained was placed into a mold.

A mold filled with a mixture of ceramic powder and polyvinylidene fluoride was thermally treated at 200° C., after which the upper electrode was formed to be subject to poling, so as to finish the piezoelectric/electrostrictive actuator.

EXAMPLE 2

Fine piezoelectric/electrostrictive ceramic powder below 0.5 μm in particle diameter made through a nonexplosive oxidative-reductive combustion process, a ceramic colloidal solution of the mehoxymethanol series having the same or similar composition as the ceramic powder, and polyvinylidene fluoride were mixed by agitating at an automatic mortar in a volume ratio 40:40:20.

The mixture obtained was transferred on to a substrate by screen printing. It was thermally treated at 150° C., after which the upper electrode was formed to be subjected to poling, so as to complete the piezoelectric/electrostrictive actuator.

A piezoelectric/electrostrictive microactuator manufactured by the above method, as shown in FIG. 1, comprises a metal vibration plate 12, a piezoelectric/electrostrictive film 16 formed on the metal vibration plate 12 and including a mixture of polyvinylidene fluoride and ceramic powder, and an upper electrode 18 formed on the piezoelectric/electrostrictive film 16.

Figure 2:
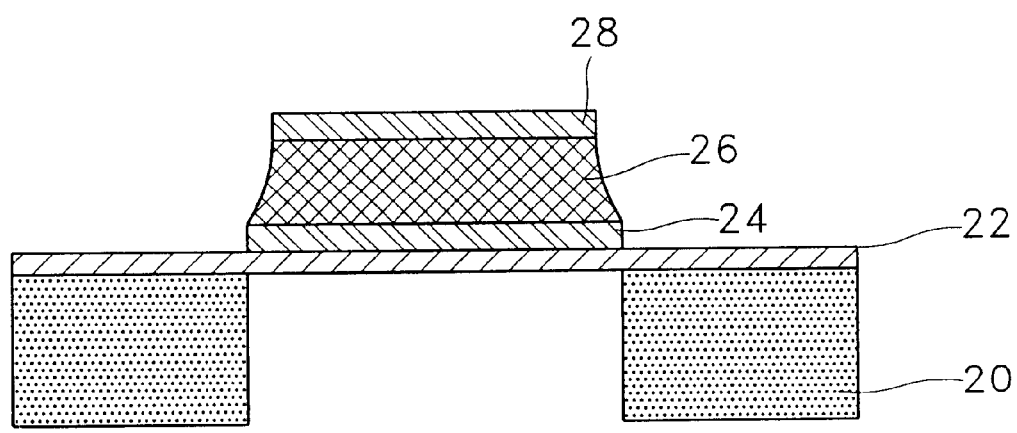
FIG. 2 is a cross-sectional view showing another embodiment of a piezoelectric/electrostrictive microactuator of the present invention.

Also a piezoelectric/electrostrictive microactuator manufactured by the above method, as shown in FIG. 2, comprises a vibration plate 22, a lower electrode 24 formed on the vibration plate 22, a piezoelectric/electrostrictive film 26 formed on the lower electrode 24 and including a mixture of polyvinylidene fluoride and ceramic powder, and an upper electrode 28 formed on the piezoelectric/electrostrictive film 26.

What is claimed is:

1. A manufacturing method of a piezoelectric/electrostrictive microactuator using a mixture of ceramic powder and polyvinylidene fluoride comprising the steps of:

providing a metal vibration plate;

preparing a mixture of polyvinylidene fluoride with ceramic powder, said ceramic powder made by a non-explosive oxidative-reductive combustion reaction at a relatively low temperature of 100–500° C. and having a particle size of below 5 μm and basic composition elements of lead (Pb) and titanium(Ti);

forming a piezoelectric/electrostrictive film on said metal vibration plate using said mixture of said ceramic powder and said polyvinylidene fluoride;

thermally treating said piezoelectric/electrostrictive film at 100–300° C.; and forming an upper electrode on said piezoelectric/electrostrictive film.

2. The method in claim 1, further comprising a step of partly drying said mixture before the step of forming said piezoelectric/electrostrictive film.

3. The method in claim 2, wherein said mixture is partly dried at 70–120° C.

4. The method in claim 1, further comprising a step of poling said upper electrode after said upper electrode is formed.

5. The method in claim 1, wherein said mixture of said ceramic powder and said polyvinylidene fluoride is made by homogeneous mixing of ceramic powder, polyvinylidene fluoride and organic solvent.

6. The method in claim 5, wherein said organic solvent is toluene or hexanol.

7. The method in claim 5, wherein a coupling agent is added in small amount when said ceramic powder and said polyvinylidene fluoride are mixed.

8. The method in claim 7, wherein said coupling agent is nitrate, sulfate, phosphate or oxalate.

9. The method in claim 1, wherein said mixture of said ceramic powder and said polyvinylidene fluoride is made by mixing ceramic powder, polyvinylidene fluoride, and ceramic sol having same or similar composition with said ceramic powder.

10. The method in claim 1, wherein said piezoelectric/electrostrictive film is thermally treated at 150–250° C.

11. A manufacturing method of a piezoelectric/electrostrictive microactuator using a mixture of ceramic powder and polyvinylidene fluoride, comprising the steps of:

providing a metal vibration plate;

preparing a mixture of polyvinylidene fluoride with ceramic powder, said ceramic powder made by a non-explosive oxidative-reductive combustion reaction at a relatively low temperature of 100–500° C. and having a particle size of below 5 μm and basic composition elements of lead(Pb) and titanium(Ti);

separately forming a piezoelectric/electrostrictive film using said mixture of said ceramic powder and said polyvinylidene fluoride;

bonding said piezoelectric/electrostrictive film and said metal vibration plate; and forming an upper electrode on said piezoelectric/electrostrictive film.

12. The method in claim 11, further comprising a step of partly drying said mixture before the step of forming said piezoelectric/electrostrictive film.

13. The method in claim 12, wherein said mixture is partly dried at 70–120° C.

14. The method in claim 11, further comprising a step of poling said upper electrode after said upper electrode is formed.

15. The method in claim 11, wherein said mixture of said ceramic powder and said polyvinylidene fluoride is made by homogeneous mixing of ceramic powder, polyvinylidene fluoride and organic solvent.

16. The method in claim 15, wherein said organic solvent is toluene or hexanol.

17. The method in claim 15, wherein a coupling agent is added in small amount when said ceramic powder and said polyvinylidene fluoride are mixed.

18. The method in claim 17, wherein said coupling agent is nitrate, sulfate, phosphate or oxalate.

19. The method in claim 11, wherein said mixture of said ceramic powder and said polyvinylidene fluoride is made by mixing ceramic powder, polyvinylidene fluoride, and ceramic sol having same or similar composition with said ceramic powder.

20. The method in claim 11, wherein said piezoelectric/electrostrictive film is thermally treated at 150–250° C. in order to bond said piezoelectric/electrostrictive film with said vibration plate.

21. A manufacturing method of a piezoelectric/electrostrictive microactuator using a mixture of ceramic powder and polyvinylidene fluoride, comprising the steps of:

providing a vibration plate;

forming a lower electrode on said vibration plate;

preparing a mixture of polyvinylidene fluoride with ceramic powder, said ceramic powder made by a non-explosive oxidative-reductive combustion reaction at a relatively low temperature of 100–500° C. and having a particle size of below 5 μm and basic composition elements of lead(Pb) and titanium(Ti);

forming a piezoelectric/electrostrictive film on said lower electrode, using said mixture of said ceramic powder and said polyvinylidene fluoride;

thermally treating said piezoelectric/electrostrictive film at 100–300° C.; and forming an upper electrode on said piezoelectric/electrostrictive film.

22. The method in claim 21, wherein said vibration plate is made of ceramic or resin.

23. The method in claim 21, further comprising a step of partly drying said mixture before the step of forming said piezoelectric/electrostrictive film.

24. The method in claim 23, wherein said mixture is partly dried at 70–120° C.

25. The method in claim 21, further comprising a step of poling said upper electrode after said upper electrode is formed.

26. The method in claim 21, wherein said mixture of said ceramic powder and said polyvinylidene fluoride is made by homogeneous mixing of ceramic powder, polyvinylidene fluoride and organic solvent.

27. The method in claim 26, wherein said organic solvent is toluene or hexanol.

28. The method in claim 26, wherein a coupling agent is added in small amount when said ceramic powder and said polyvinylidene fluoride are mixed.

29. The method in claim 28, wherein said coupling agent is nitrate, sulfate, phosphate or oxalate.

30. The method in claim 21, wherein said mixture of said ceramic powder and said polyvinylidene fluoride is made by mixing ceramic powder, polyvinylidene fluoride, and ceramic sol having same or similar composition with said ceramic powder.

31. The method in claim 21, wherein said formed piezoelectric/electrostrictive film is thermally treated at 150–250° C.

32. A manufacturing method of piezoelectric/electrostrictive microactuator using a mixture of ceramic powder and polyvinylidene fluoride, comprising the steps of:

providing a vibration plate;

forming a lower electrode on said vibration plate;

preparing a mixture of polyvinylidene fluoride with ceramic powder, said ceramic powder made by a non-explosive oxidative-reductive combustion reaction at a relatively low temperature of 100–500° C. and having a particle size of below 5 μm and basic composition elements of lead(Pb) and titanium(Ti);

separately forming a piezoelectric/electrostrictive film using said mixture of said ceramic powder and said polyvinylidene fluoride;

bonding said piezoelectric/electrostrictive film and said lower electrode; and forming an upper electrode on said piezoelectric/electrostrictive film.

33. The method in claim 32, wherein said vibration plate is made of ceramic or resin.

34. The method in claim 32, further comprising a step of partly drying said mixture before the step of forming said piezoelectric/electrostrictive film.

35. The method in claim 34, wherein said mixture is partly dried at 70–120° C.

36. The method in claim 32, further comprising a step of poling said upper electrode after said upper electrode is formed.

37. The method in claim 32, wherein said mixture of said ceramic powder and said polyvinylidene fluoride is made by homogeneous mixing of ceramic powder, polyvinylidene fluoride and organic solvent.

38. The method in claim 37, wherein said organic solvent is toluene or hexanol.

39. The method in claim 37, wherein a coupling agent is added in small amount when said ceramic powder and said polyvinylidene fluoride are mixed.

40. The method in claim 39, wherein said coupling agent is nitrate, sulfate, phosphate or oxalate.

41. The method in claim 32, wherein said mixture of said ceramic powder and said polyvinylidene fluoride is made by mixing ceramic powder, polyvinylidene fluoride, and ceramic sol having same or similar composition with said ceramic powder.

42. The method in claim 32, wherein said formed piezoelectric/electrostrictive film is thermally treated at 150–250° C. in order to bond said piezoelectric/electrostrictive film with said vibration plate.

* * * * *